(12) United States Patent
Hou

(10) Patent No.: US 10,680,575 B2
(45) Date of Patent: Jun. 9, 2020

(54) DEVICE, DIFFERENTIAL SIGNAL LINE PROCESSING METHOD AND DIFFERENTIAL SIGNAL LINE PROCESSING APPARATUS

(71) Applicant: ZTE Corporation, Shenzhen (CN)

(72) Inventor: Fangxi Hou, Shenzhen (CN)

(73) Assignee: XI'AN ZHONGXING NEW SOFTWARE CO., LTD., Shaanxi (CN)

( * ) Notice: Subject to any disclaimer, the term of this patent is extended or adjusted under 35 U.S.C. 154(b) by 0 days.

(21) Appl. No.: 16/301,470

(22) PCT Filed: Jul. 28, 2016

(86) PCT No.: PCT/CN2016/092082
§ 371 (c)(1),
(2) Date: Nov. 14, 2018

(87) PCT Pub. No.: WO2017/197759
PCT Pub. Date: Nov. 23, 2017

(65) Prior Publication Data
US 2019/0199314 A1 Jun. 27, 2019

(30) Foreign Application Priority Data
May 16, 2016 (CN) .......................... 2016 1 0325317

(51) Int. Cl.
*H03H 1/00* (2006.01)
*H03H 7/42* (2006.01)
(Continued)

(52) U.S. Cl.
CPC .............. *H03H 7/427* (2013.01); *H03H 1/00* (2013.01); *H03H 7/422* (2013.01); *H04N 5/2251* (2013.01); *H03H 2001/0092* (2013.01)

(58) Field of Classification Search
CPC ........ H04N 5/2251; H03H 1/00; H03H 7/422; H03H 7/427; H03H 2001/0092; H04L 27/00; H04L 27/227
(Continued)

(56) References Cited

U.S. PATENT DOCUMENTS 8,059,200 B2 * 11/2011 Chen .......................... H03L 7/00
348/536
8,526,557 B2 * 9/2013 Takeuchi .................. H04L 7/00
375/356
(Continued)

FOREIGN PATENT DOCUMENTS

CN 101188586 A 5/2008
CN 101841969 A 9/2010
(Continued)

OTHER PUBLICATIONS

International Search Report for corresponding application PCT/CN2016/092082 filed on Jul. 28, 2016; dated Jan. 25, 2017.

*Primary Examiner* — Marly S Camargo
(74) *Attorney, Agent, or Firm* — Cantor Colburn LLP

(57) ABSTRACT

Provided are a device, a differential signal line processing method and a differential signal line processing apparatus. The device includes a first component and a second component; the first component and the second component perform signal transmission via multiple sets of differential signal lines; the device further includes at least one common-mode filter, each common-mode filter of the at least one common-mode filter being serially connected between the first component and the second component via one set of differential signal lines, and a group delay of the each common-mode filter being adopted for adjusting a delay of signal transmission on the one set of differential signal lines connected to the common-mode filter.

20 Claims, 4 Drawing Sheets

(51) Int. Cl.
  *H04N 5/225* (2006.01)
  *H04L 27/20* (2006.01)

(58) Field of Classification Search
  USPC ......... 348/222.1, 342, 335, 295, 518; 333/1,
       333/19, 165, 166, 167, 4, 18, 138, 144,
       333/152; 257/291, 292, 443, 533;
       375/244, 283, 318, 330, 143, 152, 240.29,
       375/343, 350; 327/161, 158, 153, 149,
       327/152, 311, 65, 22, 72; 326/21
  See application file for complete search history.

(56) References Cited

U.S. PATENT DOCUMENTS

| | | | | |
|---|---|---|---|---|
| 2007/0223615 A1* | 9/2007 | Dosanjh | ................. | H04L 1/02 375/350 |
| 2008/0091099 A1* | 4/2008 | Goh | ................. | H03K 19/003 326/86 |
| 2008/0218231 A1* | 9/2008 | Goh | ................. | H03K 5/13 326/86 |
| 2010/0237961 A1* | 9/2010 | Pai | ................. | H01P 3/08 333/4 |
| 2012/0051454 A1* | 3/2012 | Zheng | ................. | H04L 27/00 375/295 |
| 2012/0280720 A1* | 11/2012 | Payne | ................. | H03K 5/003 327/72 |
| 2015/0043688 A1* | 2/2015 | Anastasov | ................. | G06F 1/04 375/354 |

FOREIGN PATENT DOCUMENTS

| | | |
|---|---|---|
| CN | 103650347 A | 3/2014 |
| CN | 104978298 A | 10/2015 |

\* cited by examiner

Acquire lengths of multiple sets of differential signal lines connected between a first component and a second component ~ 110

Select, according to the lengths of the multiple sets of differential signal lines, at least one common-mode filter respectively having a group delay meeting a predetermined condition ~ 120

DEVICE, DIFFERENTIAL SIGNAL LINE PROCESSING METHOD AND DIFFERENTIAL SIGNAL LINE PROCESSING APPARATUS

TECHNICAL FIELD

The present disclosure relates, but is not limited, to the technical field of communications.

BACKGROUND

Due to a factor of a component layout, the lengths of different high-speed differential signal lines between a camera module and an application processor of a mobile phone are unequal and thus delays of the different signal lines are unequal. Because of the unequal delays, there is a problem in a time sequence, and when the mobile phone is taking a photo, a phenomenon of an abnormal display may occur on a screen of the mobile phone during photo preview.

The following three manners are provided to solve the above problems in a related technology.

First manner: a requirement on physically equal lengths of lines is achieved by lengthening the lines and arranging the lines in a snaky shape.

Second manner: under a condition in which physical lengths of transmission lines are kept unchanged, delay adjustment is achieved by adjusting a relative dielectric constant according to a corresponding relationship between a delay time and a dielectric constant, and thus the equal-length matching purpose is achieved indirectly.

Third manner: a phase delay circuit in a form of an amplifier is added to a short line in a set of differential lines, so as to meet the requirement of equal-length within the same set of differential lines.

The above-described three manners have some drawbacks. The first manner requires a lager Printed Circuit Board (abbreviated as a PCB) space to arrange the lengthened lines. For terminal products with extremely concentrated line arrangement, this solution is time-consuming and labor-consuming. For the second manner, different media need to be adopted in different areas of a same PCB board, which is very difficult for a PCB board manufacturer. For the third manner, as a delay circuit in a form of an operational amplifier needs to be serially connected to the short line, the cost is high, and a considerable layout area is occupied, thus the feasibility for implementation of this solution in the PCB board of a terminal product is low.

SUMMARY

The following is an overview of a subject matter of the present disclosure and is not intended to limit the scope of protection of claims.

Concerning a problem that delays of different differential signal lines are unequal, no effective solution has been proposed yet in a related technology.

Some embodiments of the present disclosure provide a device, a differential signal line processing method and a differential signal line processing apparatus, which may solve a problem of a large delay difference due to unequal lengths of differential signal lines in a related technology.

A device may include a first component and a second component. The first component and the second component perform signal transmission via multiple sets of differential signal lines. The device may further include at least one common-mode filter.

Each common-mode filter of the at least one common-mode filter is serially connected between the first component and the second component via one set of differential signal lines, and a group delay of the each common-mode filter is adopted for adjusting a delay of signal transmission on the one set of differential signal lines connected to the common-mode filter.

In at least one alternative embodiment, a length of each set of differential signal lines in the multiple sets of differential signal lines has a negative correlational relationship with the group delay of the common-mode filter serially connected to the set of differential signal lines.

In at least one alternative embodiment, a number of the at least one common-mode filter is the same as a number of the multiple sets of differential signal lines; and each set of differential signal lines connected between the first component and the second component is serially connected to one common-mode filter.

In at least one alternative embodiment, the at least one common-mode filter may include at least one inductance common-mode filter.

In at least one alternative embodiment, the first component may include a camera module, and the second component may include a processor.

In at least one alternative embodiment, the first component and the second component are located in the device; and the device may include user equipment.

A differential signal line processing method may include the following acts.

Lengths of multiple sets of differential signal lines connected between a first component and a second component are acquired.

At least one common-mode filter respectively having a group delay meeting a predetermined condition is selected according to the lengths of the multiple sets of differential signal lines. Each common-mode filter of the at least one common-mode filter is serially connected between the first component and the second component via one set of differential signal lines, and the group delay of the each common-mode filter is adopted for adjusting a delay of signal transmission on the one set of differential signal lines connected to the common-mode filter.

In at least one alternative embodiment, the act that at least one common-mode filter respectively having the group delay meeting the predetermined condition is selected according to the lengths of the multiple sets of differential signal lines may include the following operation.

Multiple common-mode filters respectively having the group delay meeting the predetermined condition are selected according to the lengths of the multiple sets of differential signal lines, wherein a number of the multiple common-mode filters is equal to a number of the multiple sets of differential signal lines.

In at least one alternative embodiment, the act that the multiple common-mode filters respectively having the group delay meeting the predetermined condition are selected according to the lengths of the multiple sets of differential signal lines, wherein the number of the multiple common-mode filters is equal to the number of the multiple sets of differential signal lines, may include the following operation.

For each set of differential signal lines in the multiple sets of differential signal lines, the common-mode filter corresponding to the each set of differential signal lines is selected, so that a delay of any set of differential signal lines is equal to delays of other sets of differential signal lines, wherein the other sets of differential signal lines are sets of differential signal lines except for the any set of differential signal lines in the multiple sets of differential signal lines.

In at least one alternative embodiment, the at least one common-mode filter may include at least one inductance common-mode filter.

In at least one alternative embodiment, the first component may include a camera module, and the second component may include a processor.

In at least one alternative embodiment, the first component and the second component are located in the device; and the device may include user equipment.

A differential signal line processing apparatus may include an acquisition module and a selection module.

The acquisition module is configured to acquire lengths of multiple sets of differential signal lines connected between a first component and a second component.

The selection module is configured to select, according to the lengths of the multiple sets of differential signal lines acquired by the acquisition module, at least one common-mode filter respectively having a group delay meeting a predetermined condition, wherein each common-mode filter of the at least one common-mode filter is serially connected between the first component and the second component via one set of differential signal lines, and the group delay of the each common-mode filter is adopted for adjusting a delay of signal transmission on the one set of differential signal lines connected to the common-mode filter.

In at least one alternative embodiment, the selection module is configured to select, according to the lengths of the multiple sets of differential signal lines, multiple common-mode filters respectively having the group delay meeting the predetermined condition, wherein a number of the multiple common-mode filters is equal to a number of the multiple sets of differential signal lines.

In the device, the differential signal line processing method and the differential signal line processing apparatus provided by some embodiments of the present disclosure, multiple common-mode filters having different group delays are connected to the multiple sets of differential signal lines between the first component and the second component, common-mode filters having long group delays are selected for short differential signal lines and common-mode filters having short group delays are selected for long differential signal lines, i.e., the common-mode filters having different group delays are employed to remedy a problem of different delays caused by different lengths of the differential signal lines, so that the delay of the each set of differential signal lines connected to the two components is approximately equal. Therefore, according to some embodiments of the present disclosure, a problem of the large delay difference due to the unequal lengths of the differential signal lines in a related technology is solved, and the technical effect of adjusting the delays of the differential signal lines having unequal lengths to be approximately equal is achieved.

After reading and understanding accompanying drawings and detailed description, other aspects will become apparent.

DETAILED DESCRIPTION OF THE EMBODIMENTS

The implementation manners of the present disclosure will be described below in detail in combination with accompanying drawings. It should be noted that the embodiments of the present application and the characteristics of the embodiments may be combined with each other if there is no conflict.

The acts shown in the flowchart of the accompanying drawings may be executed in a computer system having a set of computer executable instructions. Moreover, although a logical sequence is shown in the flowchart, in some cases, the shown or described acts may be executed in other sequences different from here.

Terminologies such as "first" and "second" in the specification, claims and accompanying drawings of the present disclosure are only adopted to distinguish similar objects, rather than to describe a special order or a precedence order.

Figure 1:
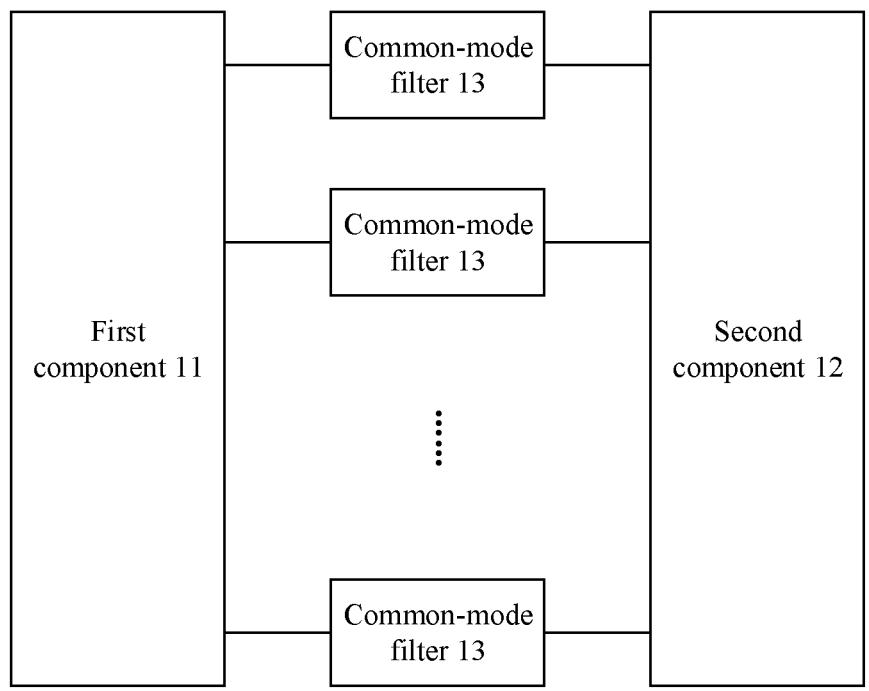
FIG. 1 is a structural schematic diagram of a device provided by an embodiment of the present disclosure.

In an embodiment of the present disclosure, there is provided a device. FIG. 1 is a structural schematic diagram of a device provided by an embodiment of the present disclosure. As shown in FIG. 1, the device provided by this embodiment may include a first component 11 and a second component 12. The first component 11 and the second component 12 perform signal transmission via multiple sets of differential signal lines. The device may further include at least one common-mode filter 13. Each common-mode filter 13 of the at least one common-mode filter 13 is serially connected between the first component 11 and the second component 12 via one set of differential signal lines, and a group delay of the each common-mode filter is adopted for adjusting a delay of signal transmission on the one set of differential signal lines connected to the common-mode filter.

For example, short differential signal lines may be serially connected to common-mode filters having long group delays, and long differential signal lines may be serially connected to common-mode filters having short group delays, i.e., the different delays caused by the different lengths of the differential signal lines are remedied by different group delays of different common-mode filters, so that on each set of differential signal lines, delays from the first component to the second component are approximately equal.

In an exemplary embodiment of the present disclosure, multiple common-mode filters having different group delays are connected to the multiple sets of differential signal lines between the first component and the second component. The common-mode filters having long group delays are selected for short differential signal lines and the common-mode filters having short group delays are selected for long differential signal lines, i.e., the common-mode filters having different group delays are employed to remedy a problem of different delays caused by different lengths of the differential signal lines, so that the delays of the each set of differential signal lines connected to the two components are approximately equal. Therefore, according to this embodiment of the present disclosure, a problem of the large delay difference due to the unequal lengths of the differential signal lines in a related technology is solved, and the technical effect of adjusting the delays of the differential signal lines having unequal lengths to be approximately equal is achieved.

In at least one alternative embodiment, a length of each set of differential signal lines in the multiple sets of differential signal lines has a negative correlational relationship with the group delay of the common-mode filter serially connected to the set of differential signal lines, i.e., the short differential signal lines may be serially connected to the common-mode filters having the long group delays, and the long differential signal lines may be serially connected to the common-mode filters having the short group delays.

In this embodiment of the present disclosure, it is assumed that m sets of differential signal lines are provided between the first component and the second component and the following formula is workable.

A time delay caused by a physical length of a first set of differential signal lines + a group delay of a common-mode filter connected to the first set of differential signal lines = a time delay caused by a physical length of a second set of differential signal lines + a group delay of a common-mode filter connected to the second set of differential signal lines = a time delay caused by a physical length of an $i^{th}$ set of differential signal lines + a group delay of a common-mode filter connected to the $i^{th}$ set of differential signal lines, where $1 \leq i \leq m$.

In at least one alternative embodiment, a number of the at least one common-mode filter is the same as a number of the multiple sets of differential signal lines. Each set of differential signal lines connected between the first component and the second component is serially connected to one common-mode filter.

For example, when N sets of differential signal lines are provided between the first component and the second component, each set of differential signal lines is serially connected to one common-mode filter, i.e., N common-mode filters are adopted between the first component and the second component. Herein, the shorter the differential signal lines, the larger the group delays of the adopted common-mode filters; and the longer the differential signal lines, the smaller the group delays of the adopted common-mode filters.

In an exemplary embodiment of the present disclosure, when N sets of differential signal lines are provided between the first component and the second component, each set of differential signal lines except for the set of longest differential signal lines is serially connected to one common-mode filter, i.e., N-1 common-mode filters are adopted between the first component and the second component.

In at least one alternative embodiment, the at least one common-mode filter may include at least one inductance common-mode filter.

In some embodiments of the present disclosure, the common-mode filters may be the inductance common-mode filters. In a related technology, in order to inhibit the common-mode noise, inductance common-mode filters may be serially connected to PCB lines. In some embodiments of the present disclosure, inductance common-mode filters having different group delays are adopted for the differential signal lines having different lengths; the shorter the differential signal lines, the larger the group delays of the adopted common-mode filters; and the longer the differential signal lines, the smaller the group delays of the adopted common-mode filters. Therefore, the different delays caused by the different lengths of the differential signal lines may be remedied by the different group delays of the different common-mode filters, a problem of the large delay difference due to the unequal lengths of the differential signal lines in a related technology is solved, and the technical effect of adjusting the delays of the differential signal lines having unequal lengths to be approximately equal is achieved. Furthermore, in the embodiments of the present disclosure, no new component is added, no extra PCB line space is occupied, the cost is low, and the implementation is easy.

In at least one alternative embodiment, the first component may include a camera module, and the second component may include a processor.

The first component may be embodied as a camera module in a mobile phone and the second component may be embodied as a processor in the mobile phone. Each set of differential signal lines connected to the camera module and the processor in the mobile phone is serially connected to one common-mode filter. The shorter the differential signal lines, the larger the group delay of the serially connected common-mode filter; and the longer the differential signal lines, the smaller the group delay of the serially connected common-mode filter. Therefore, the different delays caused by the different lengths of the differential signal lines may be remedied by the different group delays of the different common-mode filters, and thus a mobile phone screen does not display abnormally in photo preview.

In at least one alternative embodiment, the device may include user equipment.

Figure 2:
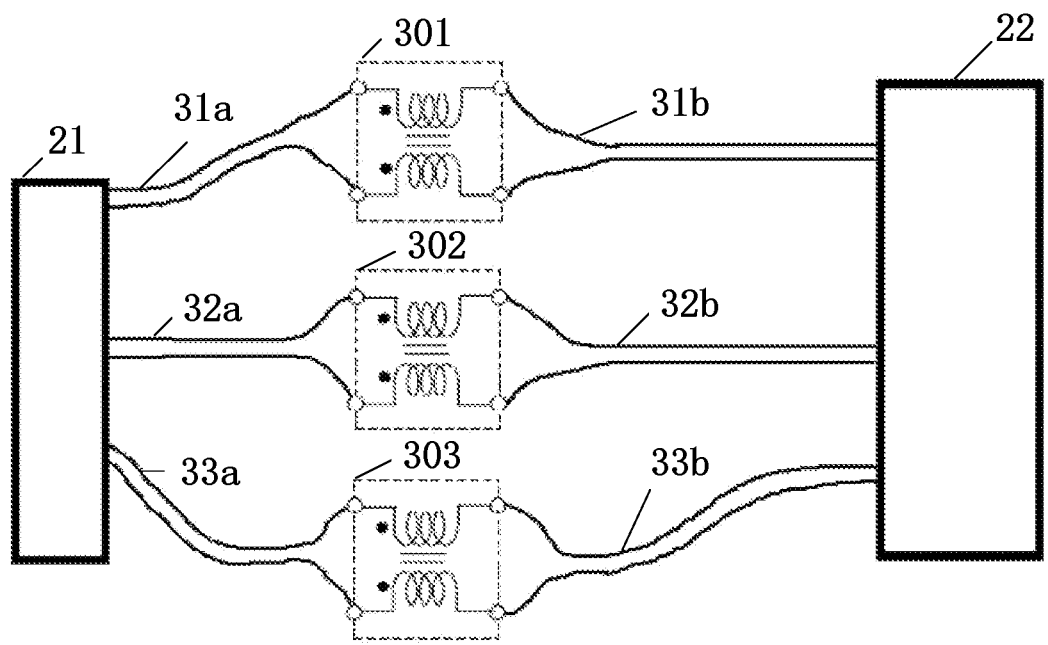
FIG. 2 is a structural schematic diagram of another device provided by an embodiment of the present disclosure.

FIG. 2 is a structural schematic diagram of another device provided by an embodiment of the present disclosure. In the device of this embodiment, differential signal lines are serially connected to common-mode filters. As shown in FIG. 2, three sets of differential signal lines are provided between a camera module 21 (namely the first component) and an image processor 22 (namely the second component). A differential signal line 31a and a differential signal line 31b form one set of differential signal lines, a differential signal line 32a and a differential signal line 32b form another set of differential signal lines, and a differential signal line 33a and a differential signal line 33b form still another set of differential signal lines.

A common-mode filter 301 is serially connected between the camera module 21 and the image processor 22 via the differential signal line 31a and the differential signal line 31b. A common-mode filter 302 is serially connected between the camera module 21 and the image processor 22 via the differential signal line 32a and the differential signal line 32b. A common-mode filter 303 is serially connected between the camera module 21 and the image processor 22 via the differential signal line 33a and the differential signal line 33b.

A sum of lengths of the differential signal line 31a and the differential signal line 31b is represented by A, a sum of lengths of the differential signal line 32a and the differential signal line 32b is represented by B, and a sum of lengths of the differential signal line 33a and the differential signal line 33b is represented by C.

According to the requirement of differential lines, the length of each set of differential signal lines should be equal, i.e., A=B=C.

However, due to a factor of a component layout, in an actual application, A is almost equal to B, C is greater than A and B.

A channel 21-31a-301-31b-22 is represented by Channel1, a channel 21-32a-302-32b-22 is represented by Channel2, and a channel 31-33a-303-33b-22 is represented by Channel3.

Figure 3:
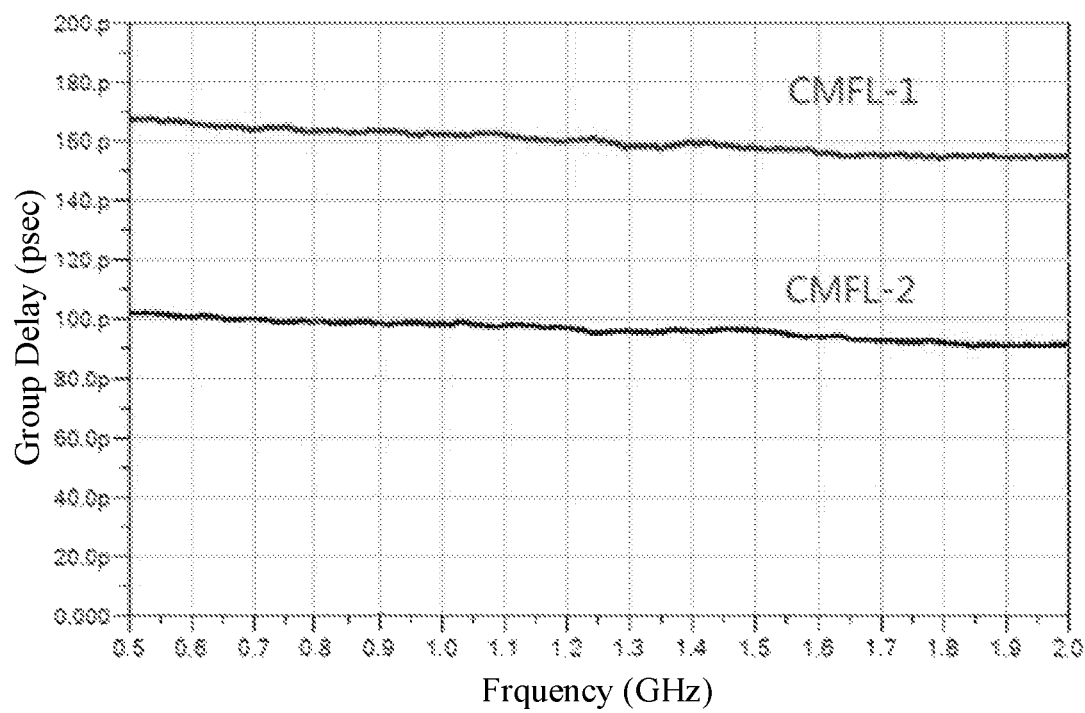
FIG. 3 is a schematic diagram of a curve for group delays of two different common-mode filters in a device provided by an embodiment of the present disclosure.
Figure 4:
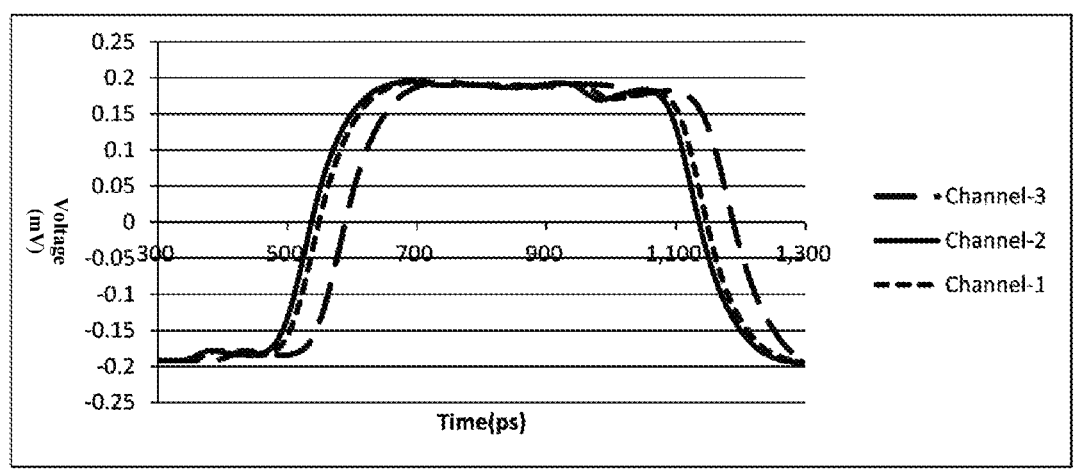
FIG. 4 is a waveform time sequence diagram obtained by applying three same common-mode filters to differential signal lines with unequal lengths in a device provided by an embodiment of the present disclosure.

When A is equal to B and a difference between C and A is 8 mm, if a same common-mode filter is adopted for the three sets of differential signal lines, for example, if the CMFL-1 common-mode filter shown in FIG. 3, which is a schematic diagram of a curve for group delays of two different common-mode filters in a device provided by an embodiment of the present disclosure, is adopted for the above three sets of differential signal lines (A, B and C), a waveform time sequence of the three sets of differential signal lines at an input port of the image processor is as shown in FIG. 4, which is a waveform time sequence diagram obtained by applying three same common-mode filters to differential signal lines with unequal lengths in a device provided by an embodiment of the present disclosure. Herein, a delay for the signal from the channel3 (namely the 31-33a-303-33b-22 channel) is 50 ps more than a delay for the signals from the other two channels (namely the 21-31a-301-31b-22 channel and the 21-32a-302-32b-22 channel).

In FIG. 3, the group delay of the CMFL-1 common-mode filter is 160 ps (ps: picosecond, 1 ps is equal to a trillionth of a second, i.e., 1 ps=$10^{-12}$ s).

In FIG. 3, the group delay of the CMFL-2 common-mode filter is 100 ps.

Figures 5, 6:
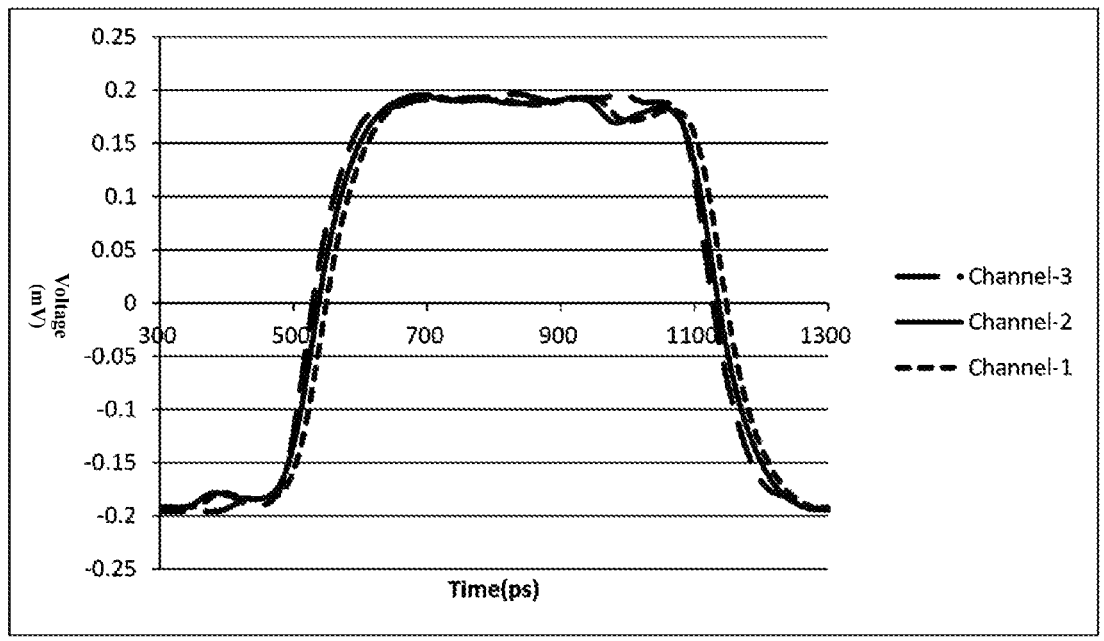
FIG. 5 is a waveform time sequence diagram obtained by applying different common-mode filters to differential signal lines with unequal lengths in a device provided by an embodiment of the present disclosure.
FIG. 6 is a flowchart of a differential signal line processing method provided by an embodiment of the present disclosure.

In this embodiment, when A is equal to B and the difference between C and A is 8 mm, the CMFL-2 common-mode filter is adopted for the Channel3 (namely the 21-33a-303-33b-22 channel) and the CMFL-1 common-mode filter is adopted for the rest two channels (namely the 21-31a-301-31b-22 channel and the 21-32a-302-32b-22 channel). The waveform time sequence of the three sets of differential signal lines at the input port of the image processor is as shown in FIG. 5, which is a waveform time sequence diagram obtained by applying different common-mode filters to differential signal lines with unequal lengths in a device provided by an embodiment of the present disclosure, and the delay difference between the signal from the Channel3 (namely the 21-33a-303-33b-22 channel) and the signal from the other two channels is within 10 ps. Apparently, a problem of the large delay difference due to the unequal lengths of the differential signal lines in a related technology is solved, the technical effect of adjusting the delays of the differential signal lines having unequal lengths to be approximately equal is achieved, and the synchronization requirement of a high-speed signal is guaranteed.

An embodiment of the present disclosure provides a differential signal line processing method. FIG. 6 is a flowchart of a differential signal line processing method provided by an embodiment of the present disclosure. As shown in FIG. 6, the differential signal line processing method provided by this embodiment may include the following acts, namely act 610 and act 620.

At act 610, lengths of multiple sets of differential signal lines connected between a first component and a second component are acquired.

At act 620, at least one common-mode filter respectively having a group delay meeting a predetermined condition is selected according to the lengths of the multiple sets of differential signal lines. Each common-mode filter of the at least one common-mode filter is serially connected between the first component and the second component via one set of differential signal lines, and a group delay of the each common-mode filter is adopted for adjusting a delay of signal transmission on the one set of differential signal lines connected to the common-mode filter.

For example, short differential signal lines may be serially connected to common-mode filters having long group delays, and long differential signal lines may be serially connected to common-mode filters having short group delays, i.e., the different delays caused by the different lengths of the differential signal lines are remedied by different group delays of different common-mode filters, so that on each set of differential signal lines, delays from the first component to the second component are approximately equal.

In this embodiment of the present disclosure, the common-mode filters having different group delays are selected, the common-mode filters having long group delays are selected for short differential signal lines and the common-mode filters having short group delays are selected for long differential signal lines. That is, the common-mode filters having different group delays are employed to remedy a problem of different delays caused by different lengths of the differential signal lines, so that the delays of different sets of differential signal lines connected to the two components are approximately equal. Therefore, a problem of the large delay difference due to the unequal lengths of the differential signal lines in a related technology is solved, and the technical effect of adjusting the delays of the differential signal lines having unequal lengths to be approximately equal is achieved.

In at least one alternative embodiment, the act that at least one common-mode filter respectively having the group delay meeting the predetermined condition is selected according to the lengths of the multiple sets of differential signal lines (i.e., the act 610) may include the following operation: multiple common-mode filters respectively having the group delay meeting the predetermined condition are selected according to the lengths of the multiple sets of differential signal lines, wherein a number of the multiple common-mode filters is equal to a number of the multiple sets of differential signal lines.

In at least one alternative embodiment, the act that multiple common-mode filters respectively having the group delay meeting the predetermined condition are selected according to the lengths of the multiple sets of differential signal lines, wherein the number of the multiple common-mode filters is equal to the number of the multiple sets of differential signal lines, may include the following operation: for each set of differential signal lines in the multiple sets of differential signal lines, the common-mode filter corresponding to the each set of differential signal lines is selected, so that a delay of any set of differential signal lines is equal to delays of other sets of differential signal lines, wherein the other sets of differential signal lines are sets of differential signal lines except for the any set of differential signal lines in the multiple sets of differential signal lines.

In an actual application, two delays being equal may refer to that the two delays are equal accurately, or that a difference between the two delays is within a preset time range. For example, when the difference between the two delays is within 10 ps (it may alternatively be other values), it may be considered that the two delays are equal.

In this embodiment of the present disclosure, it is assumed that m sets of differential signal lines are provided between the first component and the second component and the following formula is workable.

A time delay caused by a physical length of a first set of differential signal lines + a group delay of a common-mode filter connected to the first set of differential signal lines = a time delay caused by a physical length of a second set of differential signal lines + a group delay of a common-mode filter connected to the second set of differential signal lines = a time delay caused by a physical length of an $i^{th}$ set of differential signal lines + a group delay of a common-mode filter connected to the $i^{th}$ set of differential signal lines, where $1 \leq i \leq m$.

In at least one alternative embodiment, the at least one common-mode filter may include at least one inductance common-mode filter.

In at least one alternative embodiment, the first component may include a camera module and the second component may include a processor.

In at least one alternative embodiment, the first component and the second component may be located in the device; and the device may include user equipment.

With the description on the above embodiments and exemplary implementation manners, those skilled in the art should clearly know that the method in the above embodiments may be implemented via a manner of software and necessary general-purpose hardware platform. Based on such an understanding, the technical solutions of the embodiments of the present disclosure substantially or partially making contributions to a related technology or part of the technical solutions may be embodied in form of software product, and the computer software product is stored in a storage medium (such as a Read-Only Memory (ROM)/a Random Access Memory (RAM), a magnetic disk and an optical disk), including a plurality of instructions configured to enable a terminal device (which may be a personal computer, a server, network equipment or the like) to execute the method in each embodiment.

An embodiment of the present disclosure provides a differential signal line processing apparatus. The differential signal line processing apparatus is configured to implement the above embodiments and exemplary implementation manners and details that have been described will not be repeated.

Figure 7:
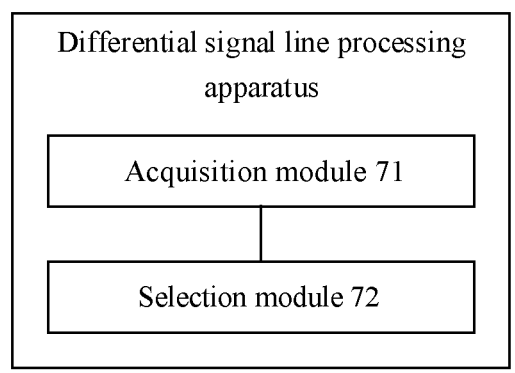
FIG. 7 is a structural schematic diagram of a differential signal processing apparatus provided by an embodiment of the present disclosure.

FIG. 7 is a structural schematic diagram of a differential signal processing apparatus provided by an embodiment of the present disclosure. As shown in FIG. 7, the differential signal processing apparatus provided by this embodiment may include an acquisition module 71 and a selection module 72.

The acquisition module 71 is configured to acquire lengths of multiple sets of differential signal lines connected between a first component and a second component.

The selection module 72 is configured to select, according to the lengths of the multiple sets of differential signal lines acquired by the acquisition module 71, at least one common-mode filter respectively having a group delay meeting a predetermined condition, where each common-mode filter of the at least one common-mode filter is serially connected between the first component and the second component via one set of differential signal lines, and a group delay of the each common-mode filter is adopted for adjusting a delay of signal transmission on the one set of differential signal lines connected to the common-mode filter.

In at least one alternative embodiment, the selection module 72 is configured to select, according to the lengths of the multiple sets of differential signal lines, multiple common-mode filters respectively having the group delay meeting the predetermined condition, a number of the multiple common-mode filters being equal to a number of the multiple sets of differential signal lines.

In an actual application, each of the above modules may be implemented via software or hardware. For hardware implementation, the solution may be, but is not limited to be, implemented via the following manner: the above modules are located in a same processor, or, the above modules are respectively located in different processors in any combined form.

An embodiment of the present disclosure provides a storage medium. In this embodiment of the present disclosure, the storage medium may be configured to store a program code for executing the following acts.

At act S1, lengths of multiple sets of differential signal lines connected between a first component and a second component are acquired.

At act S2, at least one common-mode filter respectively having a group delay meeting a predetermined condition is selected according to the lengths of the multiple sets of differential signal lines, where each common-mode filter of the at least one common-mode filter is serially connected between the first component and the second component via one set of differential signal lines, and a group delay of the each common-mode filter is adopted for adjusting a delay of signal transmission on the one set of differential signal lines connected to the common-mode filter.

In at least one alternative embodiment, the storage medium may include but is not limited to: medium capable of storing the program code such as a U disk, an ROM, an RAM, a mobile hard disk, a magnetic disk or an optical disk.

In at least one alternative embodiment, the processor is configured to execute the following act according to the program code stored in the storage medium: select multiple common-mode filters respectively having the group delay meeting the predetermined condition according to the lengths of the multiple sets of differential signal lines, a number of the multiple common-mode filters being equal to a number of the multiple sets of differential signal lines.

Examples in this embodiment of the present disclosure may be referred to those described in the above embodiments and exemplary implementation manners and will not be repeated in this embodiment.

Those of ordinary skilled in the art should understand that all or part of the acts of the embodiments may be implemented adopting a computer program flow, and the computer program may be stored in a computer readable storage medium. The computer program, when being executed on a corresponding hardware platform (according to a system, a device, an apparatus and a component, etc.), includes one of the acts in the method embodiment or combinations thereof.

Alternatively, all or part of the acts of the embodiments may also be implemented adopting an integrated circuit, these acts may be respectively formed into integrated circuit modules, or multiple modules or acts thereof are formed into a single integrated circuit module for implementation.

The apparatus/functional module/functional unit in the embodiments may be implemented by a general-purpose computing device, and the apparatus/functional module/functional unit may be concentrated on a single computing device or distributed on a network formed by a plurality of computing devices.

When being implemented in a form of software function module and sold or adopted as an independent product, the apparatus/functional module/functional unit in the embodiments may also be stored in a computer-readable storage medium. The above-mentioned computer-readable storage medium may be the ROM, the magnetic disk or the optical disk, etc.

INDUSTRIAL APPLICABILITY

With the embodiments of the present disclosure, the common-mode filters having different group delays are connected to the multiple sets of differential signal lines between the first component and the second component, the common-mode filters having long group delays are selected for short differential signal lines and the common-mode filters having short group delays are selected for long differential signal lines, i.e., the common-mode filters having different group delays are employed to remedy a problem of different delays caused by different lengths of the differential signal lines, so that the delay of the each set of differential signal lines connected to the two components is approximately equal. Therefore, according to the embodiments of the present disclosure, a problem of the large delay difference due to the unequal lengths of the differential signal lines in a related technology is solved, and the technical effect of adjusting the delays of the differential signal lines having unequal lengths to be approximately equal is achieved.

What is claimed is:

1. A device, comprising a first component and a second component, wherein the first component and the second component perform signal transmission via multiple sets of differential signal lines; the device further comprises:
   at least one common-mode filter, each common-mode filter of the at least one common-mode filter being serially connected between the first component and the second component via one set of differential signal lines, and a group delay of the each common-mode filter being adopted for adjusting a delay of signal transmission on the one set of differential signal lines connected to the common-mode filter.

2. The device according to claim 1, wherein a length of each set of differential signal lines in the multiple sets of differential signal lines has a negative correlational relationship with the group delay of the common-mode filter serially connected to the set of differential signal lines.

3. The device according to claim 1, wherein a number of the at least one common-mode filter is the same as a number of the multiple sets of differential signal lines; and each set of differential signal lines connected between the first component and the second component is serially connected to one common-mode filter.

4. The device according to claim 1, wherein the at least one common-mode filter comprises: at least one inductance common-mode filter.

5. The device according to any one of claim 1 wherein the first component comprises a camera module, and the second component comprises a processor.

6. The device according to any one of claim 1 wherein the first component and the second component are located in the device; and the device comprises user equipment.

7. A differential signal line processing method, comprising:
   acquiring lengths of multiple sets of differential signal lines connected between a first component and a second component; and
   selecting, according to the lengths of the multiple sets of differential signal lines, at least one common-mode filter respectively having a group delay meeting a predetermined condition, wherein each common-mode filter of the at least one common-mode filter is serially connected between the first component and the second component via one set of differential signal lines, and the group delay of the each common-mode filter is adopted for adjusting a delay of signal transmission on the one set of differential signal lines connected to the common-mode filter.

8. The method according to claim 7, wherein selecting, according to the lengths of the multiple sets of differential signal lines, the at least one common-mode filter respectively having the group delay meeting the predetermined condition comprises:
   selecting, according to the lengths of the multiple sets of differential signal lines, multiple common-mode filters respectively having the group delay meeting the predetermined condition, a number of the multiple common-mode filters being equal to a number of the multiple sets of differential signal lines.

9. The method according to claim 8, wherein selecting, according to the lengths of the multiple sets of differential signal lines, the multiple common-mode filters respectively having the group delay meeting the predetermined condition, the number of the multiple common-mode filters being equal to the number of the multiple sets of differential signal lines comprises:
   for each set of differential signal lines in the multiple sets of differential signal lines, selecting the common-mode filter corresponding to the each set of differential signal lines, so that a delay of any set of differential signal lines is equal to delays of other sets of differential signal lines, wherein the other sets of differential signal lines are sets of differential signal lines except for the any set of differential signal lines in the multiple sets of differential signal lines.

10. The method according to claim 7, wherein the at least one common-mode filter comprises: at least one inductance common-mode filter.

11. The method according to claim 7, wherein the first component comprises a camera module, and the second component comprises a processor.

12. The method according to claim 7, wherein the first component and the second component are located in the device; and the device comprises user equipment.

13. A differential signal line processing apparatus, comprising:
   an acquisition module, configured to acquire lengths of multiple sets of differential signal lines connected between a first component and a second component; and
   a selection module, configured to select, according to the lengths of the multiple sets of differential signal lines acquired by the acquisition module, at least one common-mode filter respectively having a group delay meeting a predetermined condition, wherein each common-mode filter of the at least one common-mode filter is serially connected between the first component and the second component via one set of differential signal lines, and the group delay of the each common-mode filter is adopted for adjusting a delay of signal transmission on the one set of differential signal lines connected to the common-mode filter.

14. The apparatus according to claim 13, wherein the selection module is configured to select, according to the lengths of the multiple sets of differential signal lines, multiple common-mode filters respectively having the group delay meeting the predetermined condition, a number of the multiple common-mode filters being equal to a number of the multiple sets of differential signal lines.

15. The apparatus according to claim 14, wherein the selection module is configured to, for each set of differential signal lines in the multiple sets of differential signal lines, select the common-mode filter corresponding to the each set of differential signal lines, so that a delay of any set of differential signal lines is equal to delays of other sets of differential signal lines, wherein the other sets of differential signal lines are sets of differential signal lines except for the any set of differential signal lines in the multiple sets of differential signal lines.

16. The apparatus according to claim 13, wherein the at least one common-mode filter comprises: at least one inductance common-mode filter.

17. The apparatus according to claim 13, wherein the first component comprises a camera module, and the second component comprises a processor.

18. The apparatus according to claim 13, wherein the first component and the second component are located in the device; and the device comprises user equipment.

19. The method according to claim 7, wherein a length of each set of differential signal lines in the multiple sets of differential signal lines has a negative correlational relationship with the group delay of the common-mode filter serially connected to the set of differential signal lines.

20. A non-volatile computer-readable storage medium, storing a program code for executing the acts in the method according to claim 7.

* * * * *